(12) United States Patent
Yagisawa et al.

(10) Patent No.: US 8,891,975 B2
(45) Date of Patent: Nov. 18, 2014

(54) OPTICAL RECEIVER AND OPTICAL TRANSMITTER

(75) Inventors: Takatoshi Yagisawa, Kawasaki (JP); Tadashi Ikeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 204 days.

(21) Appl. No.: 13/305,870

(22) Filed: Nov. 29, 2011

(65) Prior Publication Data
US 2012/0170944 A1 Jul. 5, 2012

(30) Foreign Application Priority Data

Jan. 4, 2011 (JP) ................................. 2011-000232

(51) Int. Cl.
| | | |
|---|---|---|
| H04B 10/04 | (2006.01) | |
| H04B 10/12 | (2006.01) | |
| H04B 10/06 | (2006.01) | |
| H04B 10/80 | (2013.01) | |
| H04B 10/69 | (2013.01) | |

(52) U.S. Cl.
CPC .......... H04B 10/801 (2013.01); H04B 10/6911 (2013.01); *H01L 2224/48137* (2013.01); *H01L 2924/3011* (2013.01)
USPC .......................................... 398/200; 398/214

(58) Field of Classification Search
None
See application file for complete search history.

(56) References Cited

U.S. PATENT DOCUMENTS

| | | | | |
|---|---|---|---|---|
| 5,555,533 | A * | 9/1996 | Peck ............................. | 367/132 |
| 7,536,107 | B2 * | 5/2009 | Paillet et al. .................. | 398/140 |
| 7,741,868 | B2 * | 6/2010 | Nguyen et al. ................. | 326/30 |
| 8,346,097 | B1 * | 1/2013 | Benzoni et al. ............... | 398/195 |
| 2003/0002550 | A1 * | 1/2003 | Schemmann et al. ..... | 372/38.02 |
| 2008/0044131 | A1 * | 2/2008 | Yan et al. ......................... | 385/16 |
| 2009/0245807 | A1 | 10/2009 | Nomura | |
| 2010/0086315 | A1 * | 4/2010 | Tanaka .......................... | 398/208 |
| 2010/0265682 | A1 * | 10/2010 | Martinez et al. .............. | 361/782 |
| 2011/0008005 | A1 * | 1/2011 | Meadowcroft et al. ......... | 385/88 |
| 2012/0043584 | A1 * | 2/2012 | Joshi et al. .................... | 257/184 |
| 2012/0070121 | A1 * | 3/2012 | Ito et al. .......................... | 385/88 |
| 2012/0098626 | A1 * | 4/2012 | Oshima ......................... | 333/204 |

FOREIGN PATENT DOCUMENTS

| | | |
|---|---|---|
| JP | 2003-198279 | 7/2003 |
| JP | 2009-232380 | 10/2009 |

OTHER PUBLICATIONS

InfiniBand Trade Association, "InfiniBand Roadmap", http://www.infinibandta.org/content/pages.php?pg=technology_overview Searched at Jan. 4, 2011.

* cited by examiner

*Primary Examiner* — Shi K Li
*Assistant Examiner* — Mina Shalaby
(74) *Attorney, Agent, or Firm* — Staas & Halsey LLP

(57) ABSTRACT

There is provided an optical receiver. The optical receiver includes a board to be coupled with an optical transmission line array, an optical diode array disposed on the board, and the optical diode array including a plurality of photo diodes each of which receives light from a corresponding optical transmission line in the optical transmission array. Further bias suppliers, conversion circuits, and capacitors are provided on the board or a real side of the board. Each of the photo diodes includes a first electrode and second electrodes, the first electrode receives a bias voltage supplied by a bias supplier, a current signal flowing through the second electrode is converted by a conversion circuit into a voltage signal, and one end of a capacitor is coupled to the first electrode and the other is grounded.

8 Claims, 12 Drawing Sheets

OPTICAL RECEIVER AND OPTICAL TRANSMITTER

CROSS-REFERENCE TO RELATED APPLICATION

This application is based upon and claims the benefit of priority of the prior Japanese Patent Application No. 2011-000232, filed on Jan. 4, 2011, the entire contents of which are incorporated herein by reference.

FIELD

The embodiments discussed herein are related to an optical receiver and an optical transmitter.

BACKGROUND

In optical communication, there has been used an apparatus such as an optical receiver for receiving optical signals and converting them into electrical signals, an optical transmitter for converting electrical signals into optical signals and transmitting the optical signals, or an optical transceiver formed by integrating the optical receiver with the optical transmitter to reduce the size and cost thereof. For example, refer to Japanese Laid-open Patent Publication No. 2009-232380. It has been known a monitoring circuit used in the optical transceiver which monitors a current flowing in a optical receiving element corresponding to an optical signal received by the optical receiver, which is disclosed in, for example, Japanese Laid-open Patent Publication No. 2003-198279.

An optical interconnect has attracted attention for an optical data transmission over a relative short distance in a supercomputer, server, or the like. The optical interconnect is used for a line between computers, boards, chips mounted on a board, elements included in a chip, or the like. A data rate of the signal propagated through the optical interconnect has increased over the years and is expected to increase, for example, 25 Gb/s or higher in the future. For example, it is found in "InfiniBand Roadmap" published on the web, URL: http://www.infinibandta.org/content/pages.php?pg=technology_overview, searched on Jan. 4, 2011.

The optical communication is more resistant to electromagnetic noise than electrical communication and thereby there is less interference in a transmission path than the electrical communication. Accordingly the optical interconnect adopts an optical transmission line array that has a plurality of optical transmission lines arranged at narrow pitches of 0.25 mm, for example, to reduce the size of a wiring. A wiring connection or a flip-chip connection is used for each connection between optical element, such as a light emitting element or a light receiving element, and an electric circuit.

SUMMARY

According to an aspect of the embodiment, there is provided an optical receiver. The optical receiver includes a board configured to be coupled with an optical transmission line array, the optical transmission line array including a plurality of optical transmission lines; an optical diode array disposed on the board, the optical diode array including a plurality of photo diodes, each of the plurality of photo diodes receiving light from a corresponding one of the plurality of optical transmission lines, each of the plurality of photo diodes including a first electrode and a second electrode; a plurality of bias suppliers, each of the plurality of bias suppliers being configured to apply a bias voltage to the first electrode of a corresponding one of the plurality of photo diodes; a plurality of conversion circuits, each of the plurality of conversion circuits being configured to convert a current signal flowing through the second electrode of the corresponding one of the plurality of photo diodes into a voltage signal and to output the voltage signal; and each of a plurality of capacitors each having a first end and a second end, the first end being coupled to the first electrode of the corresponding one of the photo diodes and the second end being electrically grounded.

According to another aspect of the embodiment, there is provided an optical transmitter. The optical transmitter includes a board configured to be coupled with an optical transmission line array, the optical line array including a plurality of optical transmission lines; an laser diode array disposed on the board, the laser diode array including a plurality of laser diodes, each of the a plurality of laser diodes emitting light into a corresponding one of the plurality of optical transmission lines, each of the plurality of laser diodes including a first electrode and a second electrode; a plurality of bias suppliers, each of the plurality of bias suppliers being configured to apply a bias voltage to the first electrode of a corresponding one of the plurality of laser diodes; a plurality of driving circuits, each of the plurality of driving circuits being configured to convert an input voltage signal into a current signal and to feed the current signal to the second electrode; and each of a plurality of capacitors having a first end and a second end, the first end being coupled to the first electrode of the corresponding one of the laser diodes and the second end being electrically grounded.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

[Preliminary Consideration]

Figure 1:
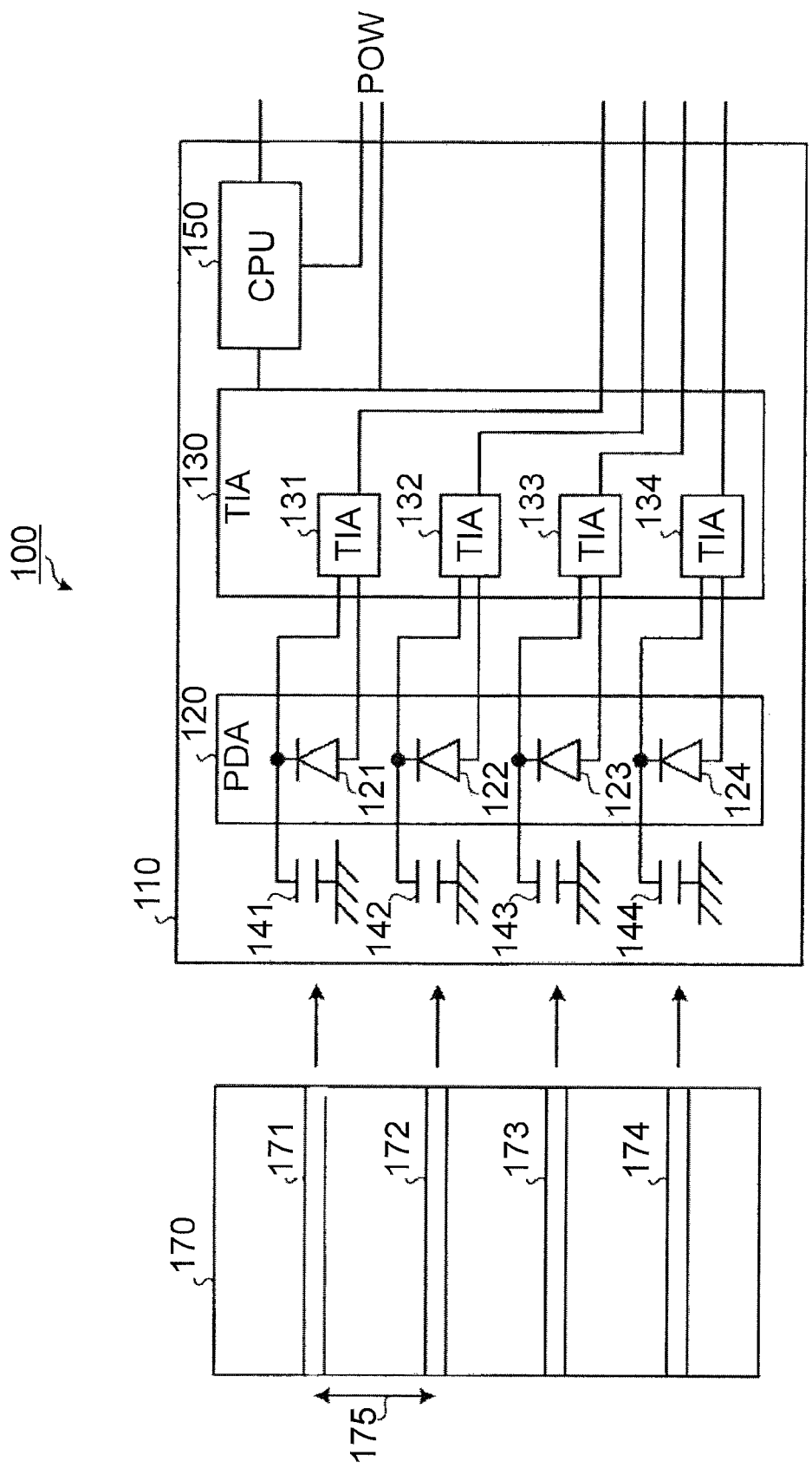
FIG. 1 is a diagram illustrating an example of an optical receiver according to a first embodiment.

The aforementioned conventional techniques have a problem that it is difficult to obtain a broadband characteristic that satisfies a wide frequency range of a signal. Specifically, since the optical transmission lines are arranged at narrow pitches, the optical elements (light emitting elements and light receiving elements) that correspond to the optical transmission lines are also arranged at narrow pitches. Thus, a connection pitch between each of the optical elements and the electric circuit is small. It is, therefore, difficult to obtain a characteristic (satisfying a wide frequency range of a signal) at each of locations at which the optical elements are connected to the electric circuit.

When a flip-chip connection is provided to connect each of the optical elements to the electric circuit, it is difficult to set distances between the optical elements and the electric circuit to small values, owing to the fact that an underfill material may start to flow. When the distances between the optical elements and the electric circuit are long, and a high speed signal is transmitted to the long distance, a potential becomes unstable and the signal is degraded. It is, thus, difficult to obtain the broadband characteristic that satisfies the wide frequency range of the signal.

In addition, when a wiring is provided to connect each of the optical elements to the electric circuit, it is difficult to control an impedance of the wiring. Furthermore, it is difficult to set the distances between the optical elements and the electric circuit to small values. It is, therefore, difficult to obtain the broadband characteristic that satisfies the wide frequency range of the signal.

Accordingly, it is preferable to obtain an optical receiver and an optical transmitter to eliminate the aforementioned problems to achieve a broadband characteristic satisfying a wide frequency range of a signal.

In order to solve the aforementioned problems and to achieve the broadband characteristic satisfying the wide frequency range of the signal, a technique disclosed herein includes: a board that is connected to an optical transmission line array having a plurality of optical transmission lines; a photodiode array that is mounted on the board and has a plurality of photodiodes that receive light from the plurality of optical transmission lines; bias supply units that are provided for the photodiodes and apply bias voltages to first electrodes of the photodiodes; conversion circuits that are provided for the photodiodes, convert current signals flowing from second electrodes of the photodiodes into voltage signals and output the voltage signals, the second electrodes being different from the first electrodes of the photodiodes; and capacitors that are provided for the photodiodes and have ends connected to the first electrodes and other ends grounded.

The optical receiver disclosed herein and the optical transmitter disclosed herein may each obtain a broadband characteristic that satisfies a wide frequency range of a signal.

Embodiments of the technique disclosed herein are described below in detail with reference to the accompanying drawings.

[First Embodiment]

[Configuration of Optical Receiver]

FIG. 1 is a diagram illustrating an example of an optical receiver according to a first embodiment. The optical receiver 100 according to the first embodiment is a device that receives light output from optical transmission lines 171 to 174 arranged in an optical transmission line array 170. The optical transmission lines 171 to 174 are optical fibers or optical waveguides, for example. As illustrated in FIG. 1, the optical receiver 100 includes a board 110, a photodiode (PD) array 120, a transimpedance amplifier (TIA) circuit 130, capacitors 141 to 144 and a central processing unit (CPU) 150. The board 110 is connected to the optical transmission line array 170. The board 110 is a flexible printed circuits board, for example. Reference numeral 175 indicates pitches of 0.25 mm, for example, at which the optical transmission lines 171 to 174 are arranged.

On the board 110 there is provided the PD array 120 in which photodiodes (PDs) 121 to 124 are arranged. The PDs 121 to 124 receive light from the optical transmission lines 171 to 174, respectively, to perform a photoelectric conversion on the received light. Anodes and cathodes of the PDs 121 to 124 are connected to the TIA circuit 130.

The TIA circuit 130 is controlled by the CPU 150 and thereby converts the currents photo-electrically converted by the PDs 121 to 124 into voltages. Specifically, the TIA circuit 130 includes transimpedance amplifiers (TIAs) 131 to 134. The TIAs 131 to 134 serve as bias supply units that apply bias voltages to the cathodes (first electrodes) of the PDs 121 to 124 by use of power supplied from an external power supply, for example.

The TIAs 131 to 134 may have functions of monitoring currents of bias voltages to be supplied to the PDs 121 to 124 to monitor light reception states of the PDs 121 to 124, respectively. The TIAs 131 to 134 each serve also as conversion circuits that convert respective current signals flowing in the anodes (second electrodes) of the PDs 121 to 124 into voltage signals. The TIAs 131 to 134 output the converted voltage signals each to respective downstream-side electrical processing circuits.

Characteristic impedances of lines that connect the anodes of the PDs 121 to 124 each with respective TIAs 131 to 134 are preferably matched to input impedances each of the TIAs 131 to 134 for impedance matching. The characteristic impedances of the lines may be adjusted by changing, for example, the widths each of the respective lines. Thus, the transfer characteristics of signals between the PDs 121 to 124 and the TIAs 131 to 134, respectively, may be improved as illustrated for example in FIG. 6B, which may be explained later.

The capacitors 141 to 144 each have ends connected to the respective cathodes of the PDs 121 to 124. The other ends of the capacitors 141 to 144 each are grounded. This configuration may reduce cathode-side impedances each of the respective PDs 121 to 124 and stabilize signals that are input to the TIAs 131 to 134 from the PDs 121 to 124.

The CPU 150 operates using power supplied from the external power supply, for example, and controls the TIA circuit 130 on the basis of a control signal from an external. In addition, the CPU 150 may acquire information concerning the light reception states of the PDs 121 to 124 monitored by the TIAs 131 to 134 and control the TIA circuit 130 on the basis of the acquired information concerning the light reception states.

Although the configuration explained above directs to that the TIAs 132 to 134 function as the bias supply units to apply the bias voltages to the PDs 121 to 124, a function of the bias supply units is not limited to the configuration. A bias supply unit(s) may be provided separately from the TIA 131 to 134 to apply the bias voltages each to the respective PD 121 to 124.

Figure 2:
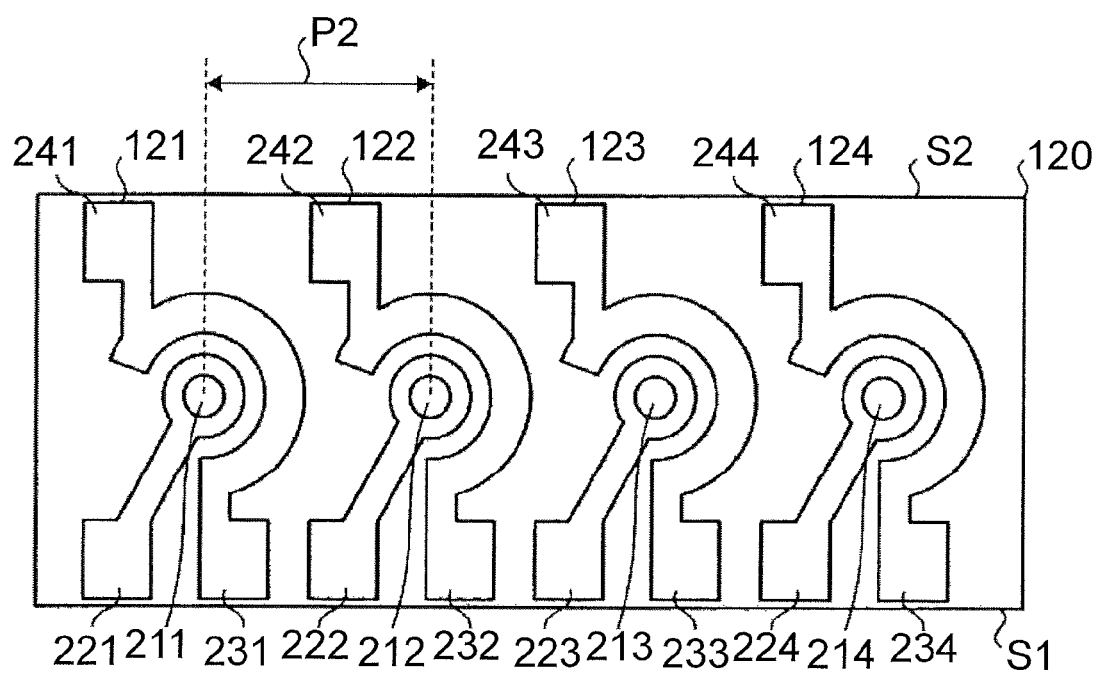
FIG. 2 is a diagram illustrating an example of a PD array.

FIG. 2 is a diagram illustrating an example of the PD array. In FIG. 2, parts that are the same as the parts illustrated in FIG. 1 are indicated by the same reference numerals, and a description thereof is omitted. As illustrated in FIG. 2, the PD array 120 includes active areas 211 to 214, anode pads 221 to 224, cathode pads 231 to 234 and capacitor pads 241 to 244, for example. "P1" in FIG. 2 indicates representatively a pitch, for example 0.25 mm, at which the PDs 121 to 124 are spaced each other equally to be arranged.

The active areas 211 to 214 each are light receiving regions of the respective PDs 121 to 124. The anode pads 221 to 224 are electrodes that are connected to the anodes of the PDs 121 to 124, respectively. Signal input units of the TIAs 131 to 134 are connected or coupled to the anode pads 221 to 224, respectively. The cathode pads 231 to 234 are electrodes that are connected or coupled to the cathodes of the PDs 121 to 124, respectively. The bias supply units of the TIAs 131 to 134 are connected to the cathode pads 231 to 234, respectively.

The capacitor pads 241 to 244 are electrodes that are connected to the cathodes of the PDs 121 to 124, respectively. Thus, the capacitor pads 241 to 244 are also connected to the cathode pads 231 to 234, respectively. Ends of the capacitors 141 to 144 are connected to the capacitor pads 241 to 244, respectively.

The anode pads 221 to 224 and the cathode pads 231 to 234 are located in the vicinity of a side S1 of the PD array 120. The capacitor pads 241 to 244 are located in the vicinity of a side S2 of the PD array 120. As illustrated in FIG. 2, the side S2 of the PD array 120 is located on the opposite side of the side S1 of the PD array 120. The PD array 120 includes the cathode pads 231 to 234 (first pads) that are located in the vicinity of the side S1 (one side) to connect the cathodes (first electrodes) of the PDs 121 to 124 to the TIAs 131 to 134 (bias supply units).

The PD array 120 includes the anode pads 221 to 224 (second pads) for connecting the respective anodes (second electrodes) of the PDs 121 to 124 with the respective TIAs 131 to 134 (conversion circuits). The anode pads 221 to 224 are located in the vicinity of the side Si. Furthermore, the PD array 120 includes the capacitor pads 241 to 244 (third pads) for connecting the respective cathodes of the PDs 121 to 124 with the respective capacitors 141 to 144. The capacitor pads 241 to 244 are located in the vicinity of the side S2 different from the side S1.

Thus, the capacitors 141 to 144 may be located at positions that are different from the positions of the TIAs 131 to 134 (bias supply units and conversion circuits). For example, the capacitors 141 to 144 may be located on the opposite side of the TIAs circuits 131 to 134 with respect to the PD array 120. Therefore, even when the PDs 121 to 124 are arranged at the narrow pitches, it is easy to ensure a space in which the capacitors 141 to 144 are arranged.

Figure 3A:
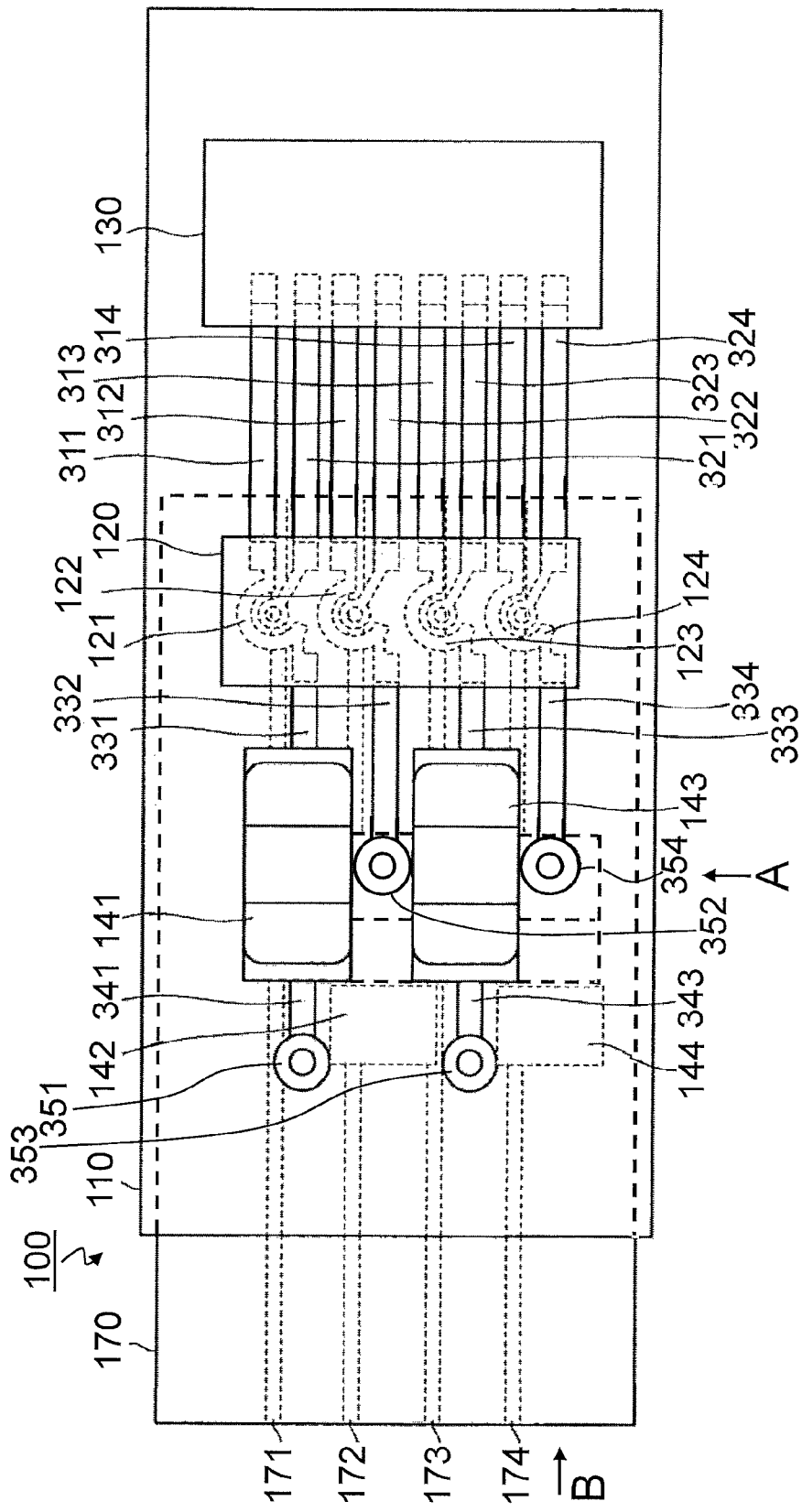
FIG. 3A is a plan view of a first example of the configuration of the optical receiver.
Figure 3B:
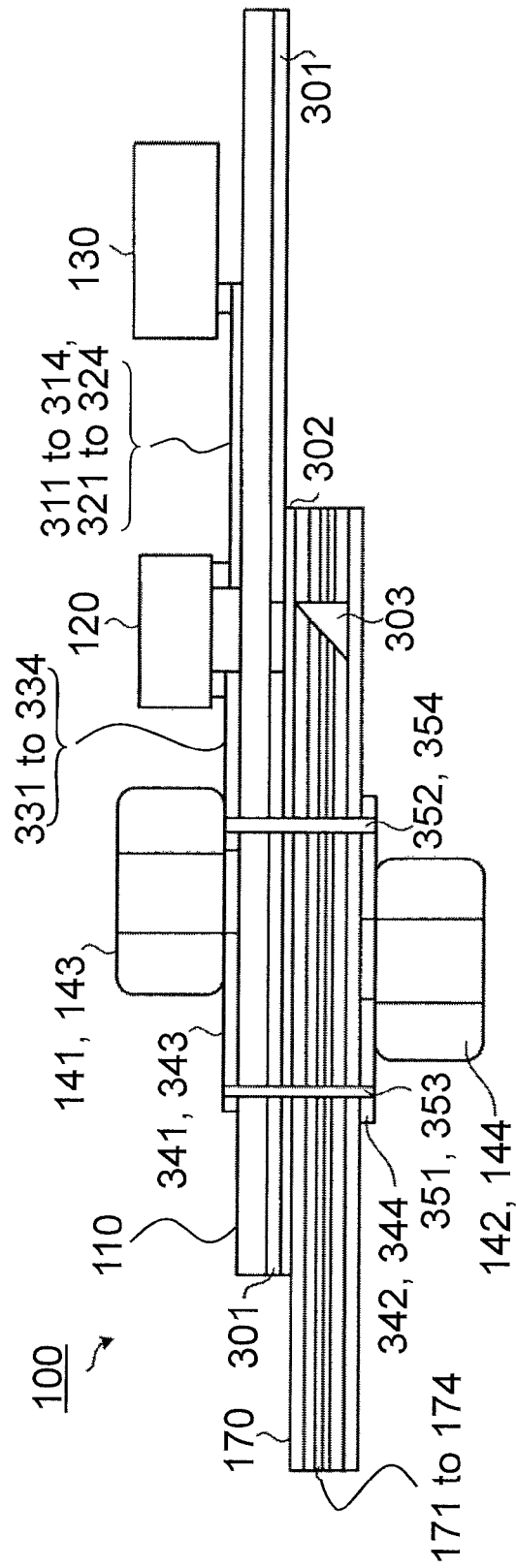
FIG. 3B is a cross-sectional view of the optical receiver illustrated in FIG. 3A when the optical receiver illustrated in FIG. 3A is viewed from a side surface of the optical receiver illustrated in FIG. 3A.
Figure 3C:
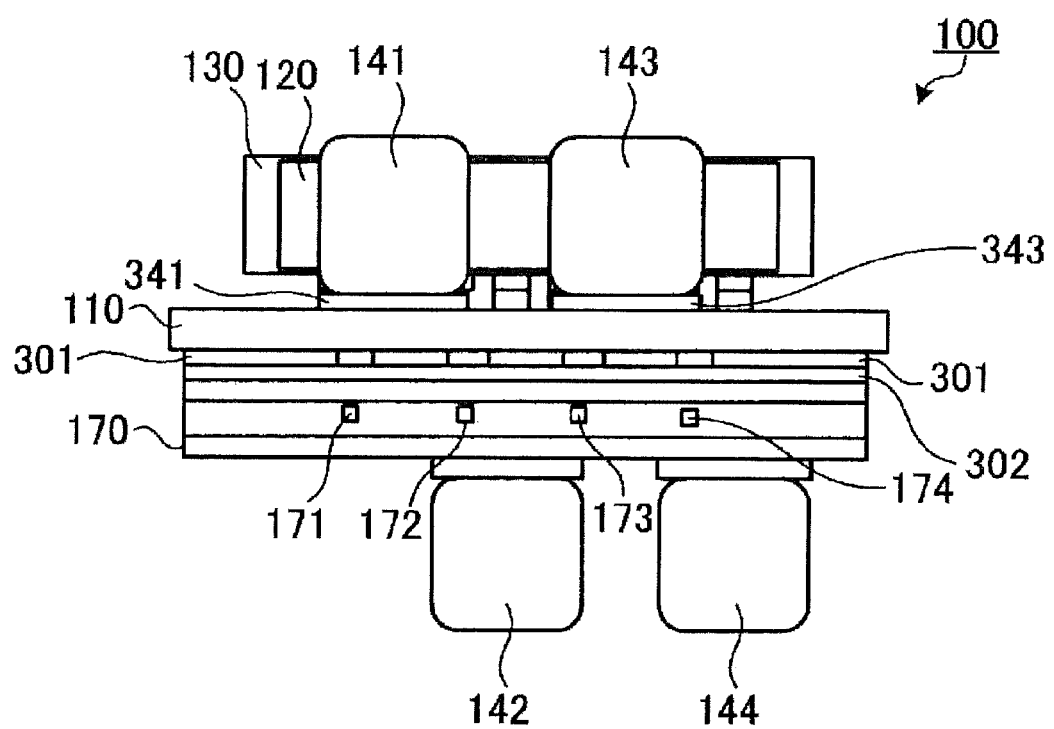
FIG. 3C is a cross-sectional view of the optical receiver illustrated in FIG. 3A when the optical receiver illustrated in FIG. 3A is viewed from a front surface of the optical receiver illustrated in FIG. 3A.

FIG. 3A is a plan view of a first example of the configuration of the optical receiver 100. FIG. 3B is a cross-sectional view, looking along the direction of the arrow A illustrated in FIG. 3A, of the optical receiver 100 illustrated in FIG. 3A. FIG. 3C is a cross-sectional view, looking along the direction of the arrow B illustrated in FIG. 3A, of the optical receiver 100 illustrated in FIG. 3A. In FIG. 3C, an illustration of a part of a wiring is omitted. As illustrated in FIGS. 3A to 3C, the optical receiver 100 according to the first example has a configuration in which the PD array 120 is connected to the TIA circuit 130 by a flip-chip connection. The board 110 includes two surfaces opposing to each other, one is referred as a front surface on which the PD array 120 is mounted and the other is referred as a back surface. As described later, the "front and back surfaces" are used in another embodiment such as in that of FIGS. 4A and 4B.

The optical transmission lines 171 to 174 are waveguides that are arranged in the optical transmission line array 170. The PD array 120 is mounted on the board 110 so that the light receiving regions face the board 110. A ground 301, which is illustrated explicitly in FIGS. 3B and 3C, is disposed on the back surface of the board 110 to serve a ground. The optical transmission line array 170 is adhered to the ground 301 with a bonding layer 302. A mirror 303 is arranged in the optical transmission line array 170.

A portion of the board 110 and the ground 301 between the PD array 120 and the mirror 303 is removed by a laser machining or the like to form an opening therebetween. Toward the opening, light is reflected by the mirror 303 when becoming incident thereto from the optical transmission lines 171 to 174. Thereby the light from the respective optical transmission lines 171 to 174 is received by the PD 121 to 124 each. It may be not necessary to form the opening through the board 110 if the board 110 is of optical transparent.

The cathodes of the PDs 121 to 124 are connected to the TIA circuit 130 through respective bumps 311 to 314 (bias supply lines). The anodes of the PDs 121 to 124 are connected to the TIA circuit 130 through respective bumps 321 to 324 (bias supply lines). Through holes 351 to 354 extend from the front surface of the board 110 to a surface located on the opposite side of the board 110.

The capacitors 141 and 143 are arranged on the side of the front surface of the board 110. The capacitors 142 and 144 are arranged on a surface of the optical transmission array 170. The surface is opposite to another surface of the optical transmission array 170 which faces the back surface of the board 110 as illustrated in FIG. 3B. The cathodes of the PDs 121 and 123 are connected to the capacitors 141 and 143 through bumps 331 and 333, respectively. The cathodes of the PDs 122 and 124 are connected to the capacitors 142 and 144 through bumps 332 and 334 and the through holes 352 and 354, respectively.

The bumps 341 to 344 connect the capacitors 141 to 144 to the ground 301. The capacitors 141 and 143 that are arranged on the side of the front surface of the board 110 are connected to the ground 301 through the bumps 341 and 343 and the through holes 351 and 353, while the ground 301 is attached to the back surface of the board 110.

As described above, the capacitors 141 and 143 are arranged on the side of the front surface (first surface) of the board 110, while the capacitors 142 and 144 are arranged on the side of the back surface (second surface) of the board 110. Thus, even when the PDs 121 to 124 are arranged at the narrow pitches, the capacitors 141 to 144 each may be connected to the respective PDs 121 to 124. For example, if capacitors that each have a size of 0.6 mm×0.3 mm are used as the capacitors 141 to 144, the capacitors 141 to 144 may not be arranged in a single row at pitches of 0.25 mm to be connected with, for example, the PDs. On the other hand, arranging appropriately the capacitors 141 to 144 on the both sides of the board 110 may achieve the connection between the capacitors 141 to 144 and the optical transmission lines 171 to 174 which are arranged at the pitches of 0.25 mm.

As illustrated in FIG. 3A, the capacitors 141 to 144 are alternately arranged on the sides of the front and back surfaces of the board 110 in a direction in which the PDs 121 to 124 are arranged. This configuration enables distances between the PDs 121 to 124 and the capacitors 141 to 144 to be small values and signal transfer characteristics of channels to be improved.

The optical transmission line array 170 is arranged on the side of the back surface of the board 110. The capacitors 142 and 144 are arranged on the opposite side of the board 110 with respect to the optical transmission line array 170. The capacitors 142 and 144 are connected to the cathodes of the PDs 122 and 124 through the through holes 352 and 354 formed in the optical transmission line array 170 and the board 110. Thus, even when the capacitors 141 to 144 are arranged appropriately on the both sides of the front and back surfaces of the board 110, the capacitors 141 to 144 may be connected to the PDs 121 to 124.

Figure 4A:
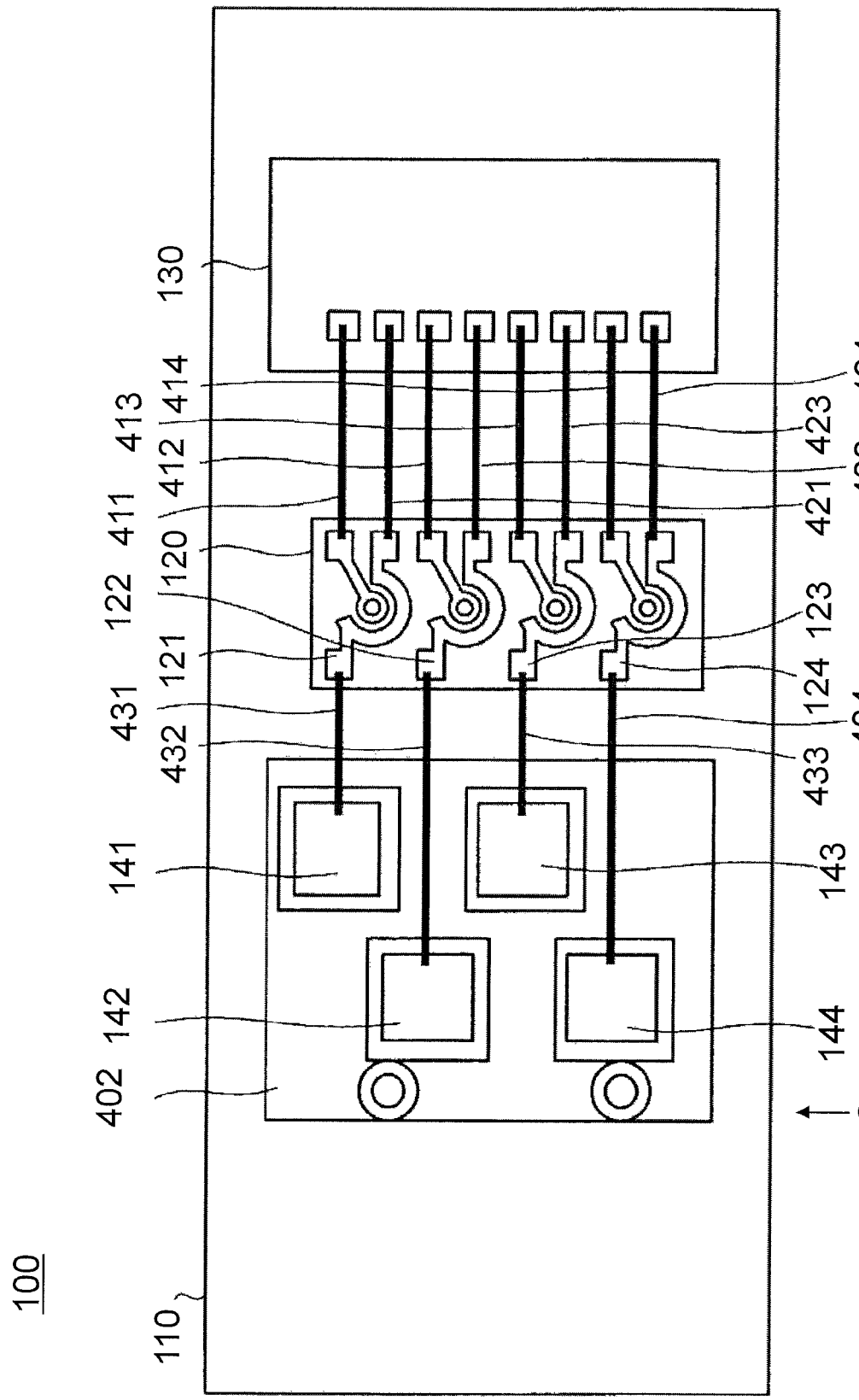
FIG. 4A is a plan view of a second example of the configuration of the optical receiver.
Figure 4B:
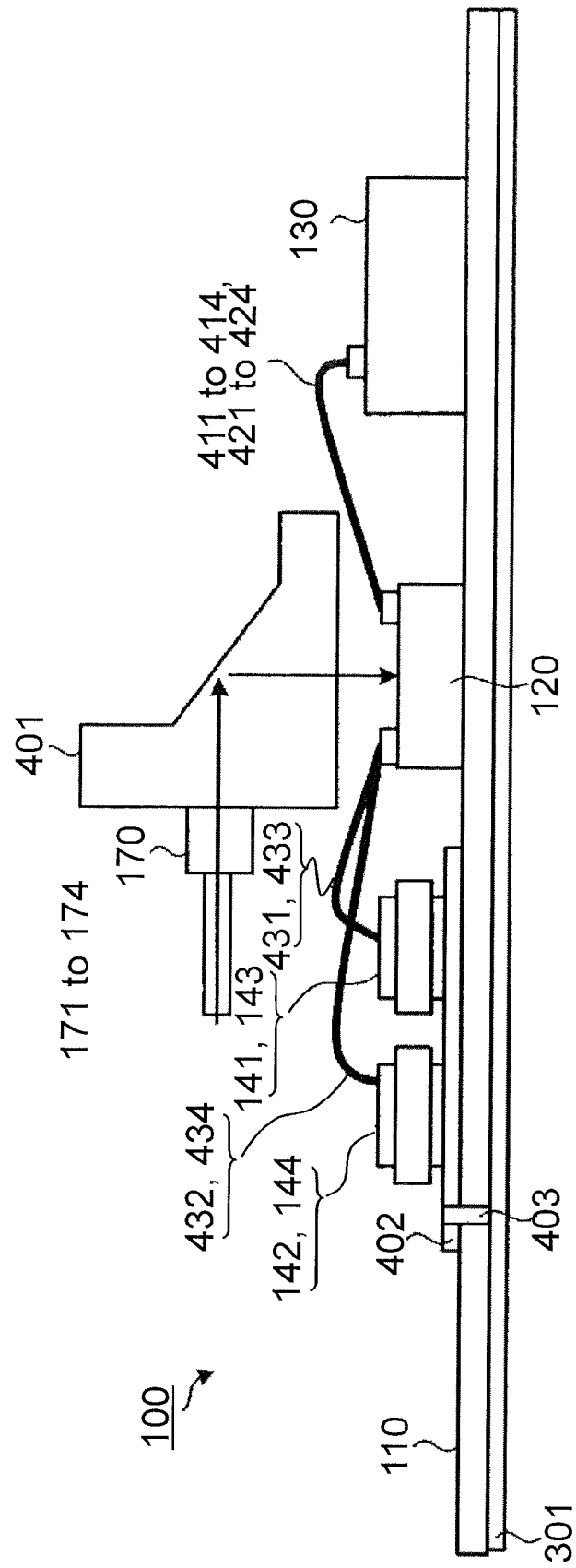
FIG. 4B is a cross-sectional view of the optical receiver illustrated in FIG. 4A when the optical receiver illustrated in FIG. 4A is viewed from a side surface of the optical receiver illustrated in FIG. 4A.

FIG. 4A is a plan view of a second example of the configuration of the optical receiver. FIG. 4B is a cross-sectional view looking along the direction of the arrow C illustrated in FIG. 4A, of the optical receiver illustrated in FIG. 4A. In FIG. 4A, the optical transmission array 170 and a mirror 401, which are illustrated in FIG. 4B, are omitted. In FIGS. 4A and 4B, parts that are the same as the parts illustrated in FIGS. 3A to 3C are indicated by the same reference numerals, and a description thereof is omitted. As illustrated in FIGS. 4A and 4B, the optical receiver 100 according to the second example has a configuration in which the PD array 120 is connected to the TIA circuit 130 by a wiring connection.

The optical transmission lines 171 to 174, which are illustrated in FIG. 4B, are optical fibers, for example. The PD array 120 is arranged on the board 110 so that the light receiving regions of the PD array 120 face upward as illustrated in FIG. 4A. As illustrated in FIG. 4B, the optical transmission line array 170 is arranged on the side of the front surface of the board 110. The mirror 401 is connected to the optical transmission line array 170. The mirror 401 reflects light that has been incident from the optical transmission lines 171 to 174 to output the reflected light to the PDs 121 to 124. This configuration enables the light incident from the optical transmission lines 171 to 174 to be received by the PDs 121 to 124. A ground 402 is arranged on the front surface of the board 110. The grounds 301 and 402 are connected to each other with a through hole 403 that is formed in the board 110.

The cathodes each of the PDs 121 to 124 are connected to the TIA circuit 130 through respective wires 411 to 414 (bias supply lines). The anodes of the PDs 121 to 124 are connected to the TIA circuit 130 through respective wires 421 to 424 (bias supply lines). The ends of the capacitors 141 to 144 are connected to the ground 402 arranged on the front surface of the board 110, while the other ends of the capacitors 141 to 144 are connected to the PDs 121 to 124 through wires 431 to 434.

[Signal Transfer Characteristics]

Next, signal transfer characteristics of the optical receiver 100 are described. Although a transfer characteristic of a signal between the PD 121 and the TIA 131 is described below, the same applies to transfer characteristics of signals between the PDs 122 to 124 and the TIAs 132 to 134.

[Simulation Model]

Figure 5A:
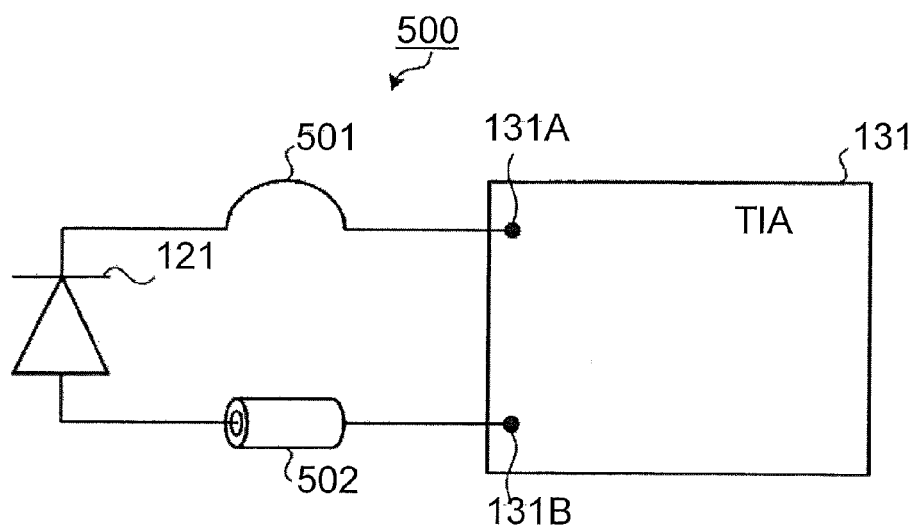
FIG. 5A is a reference diagram illustrating a first example of a model for simulating a signal transfer characteristic.

FIG. 5A is a reference diagram illustrating a first example of a model for simulating the transfer characteristic of the signal. A simulation model 500 as a reference illustrated in FIG. 5A includes the PD 121 and the TIA 131, in which the PD 121 is not connected to the capacitor 141. A bias supply unit 131A of the TIA 131 is a part that outputs a bias voltage to be supplied to the cathode of the PD 121. A signal input unit 131B of the TIA 131 is a part to receive current that will flow in the anode of the PD 121.

A bias supply line 501 is a model of a line that is located between the bias supply unit 131A and the cathode of the PD 121. The bias voltage is supplied from the bias supply unit 131A to the cathode of the PD 121 through the bias supply line 501. A signal line 502 is a model of a line that is located between the anode of the PD 121 and the signal input unit 131B. A signal received by the PD 121 is input to the signal input unit 131B through the signal line 502.

Figure 5B:
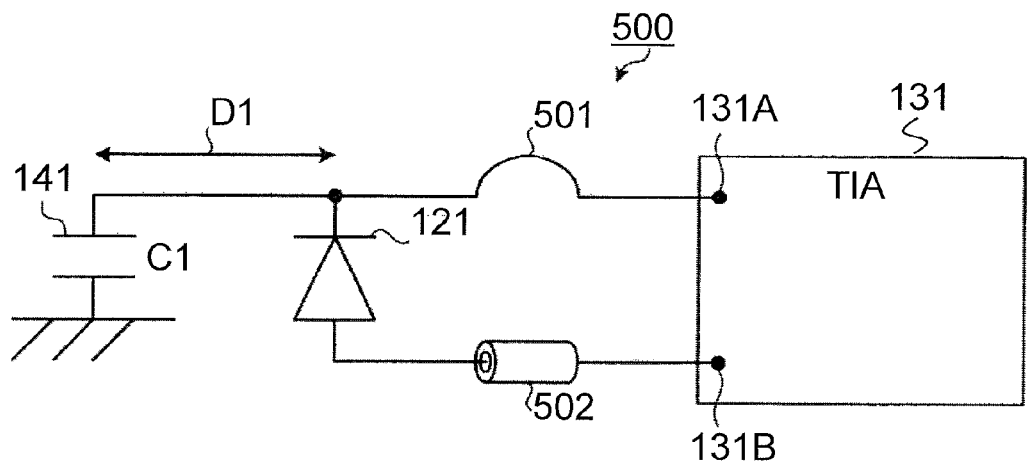
FIG. 5B is a diagram illustrating a second example of the model for simulating the signal transfer characteristic.

FIG. 5B is a diagram illustrating a second example of the model for simulating the transfer characteristic of the signal. In FIG. 5B, parts that are the same as the parts illustrated in FIG. 5A are indicated by the same reference numerals, and a description thereof is omitted. In the simulation model 500 illustrated in FIG. 5B, the cathode of the PD 121 is connected to the capacitor 141. A distance D1 indicates a distance between the cathode of the PD 121 and the capacitor 141. A capacitance C1 indicates that of the capacitor 141.

[Simulation Results in the Case of Using Flip-Chip Implementation]

With reference to FIGS. 6A to 6D, there is described below a transfer characteristics of a signal which are obtained when the bias supply line 501 and the signal line 502 are installed using a flip-chip implementation.

Figure 6A:
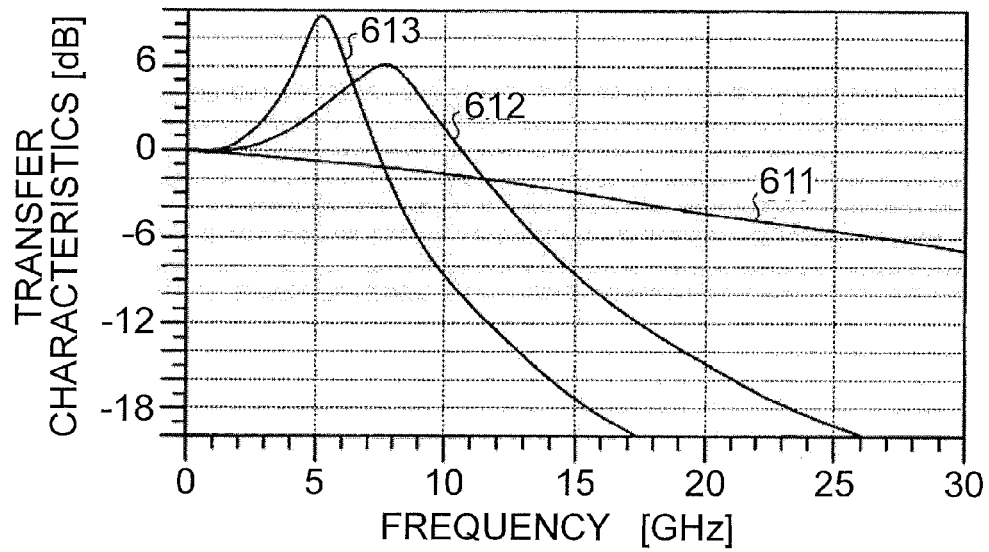
FIG. 6A is a graph illustrating a first example of results of a simulation of signal transfer characteristics.

FIG. 6A is a graph illustrating a first example of results of a simulation of the transfer characteristics of the signal, in which the horizontal axis indicates a frequency (GHz) and the vertical axis indicates a transfer characteristic (dB) of the signal. A transfer characteristic 611 illustrates a resultant transfer characteristic of the signal when assuming that the length of the bias supply line 501 is 0 mm in the simulation model 500 illustrated in FIG. 5A. A transfer characteristic 612 illustrates a resultant transfer characteristic of the signal in the case of the length of the bias supply line 501 being 1 mm. A transfer characteristic 613 illustrates a resultant transfer characteristic of the signal in the case of the length of the bias supply line 501 being 2 mm.

The transfer characteristics 611 to 613 are apparently improved with decreasing the length of the bias supply line 501. In other words, as the length of the bias supply line 501 is shorter, a frequency range in which the transfer characteristic of the signal is ensured is larger (broadband characteristic).

Figure 6B:
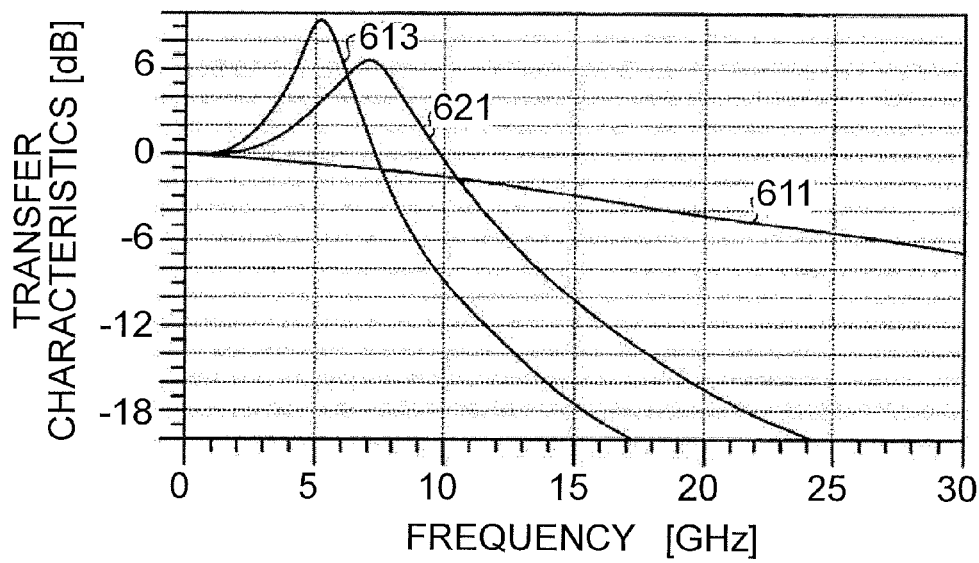
FIG. 6B is a graph illustrating a second example of the results of the simulation of the signal transfer characteristics.

FIG. 6B is a graph illustrating a second example of the results of the simulation of the transfer characteristics of the signal. In FIG. 6B, the horizontal axis indicates the frequency (GHz), and the vertical axis indicates the transfer characteristic (dB) of the signal. In FIG. 6B, parts that are the same as the parts illustrated in FIG. 6A are indicated by the same reference numerals, and a description thereof is omitted.

A transfer characteristic 621 illustrated in FIG. 6B is a transfer characteristic of the signal when a characteristic impedance of the signal line 502 is matched to an input impedance of the signal input unit 131B in the simulation model 500 illustrated in FIG. 5A. The transfer characteristic 621 is a result assuming the length of the bias supply line 501 being 2 mm. Comparing the transfer characteristics 613 and 621, it is apparent from comparison of the transfer characteristic 613 and 621 that the transfer characteristic of the signal may be improved by matching the characteristic impedance of the signal line 502 with the input impedance of the TIA 131.

Figure 6C:
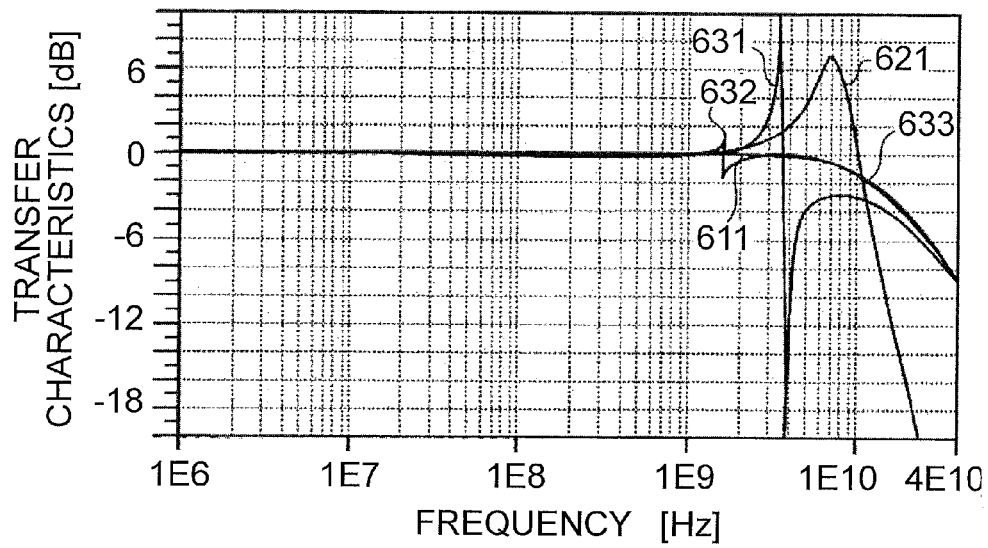
FIG. 6C is a graph illustrating a third example of the results of the simulation of the signal transfer characteristics.

FIG. 6C is a graph illustrating a third example of the results of the simulation of the transfer characteristics of the signal. In FIG. 6C, the horizontal axis indicates the frequency (GHz), and the vertical axis indicates the transfer characteristic (dB) of the signal. In FIG. 6C, the frequency is plotted along the horizontal axis in a form of a logarithmic expression and parts that are the same as the parts illustrated in FIG. 6B are indicated by the same reference numerals without a description thereof. A transfer characteristic 631 illustrated in FIG. 6C indicates a transfer characteristic of the signal when the capacitor 141 has the capacitance C1 of 1 pF and is connected to the bias supply line 501 in the simulation model 500 illustrated in FIG. 5B.

A transfer characteristic 632 indicates a transfer characteristic of the signal when the capacitor 141 has the capacitance C1 of 10 pF and is connected to the bias supply line 501. A transfer characteristic 633 indicates a transfer characteristic of the signal when the capacitor 141 has the capacitance C1 of 100 pF and is connected to the bias supply line 501. The transfer characteristic 633 nearly overlaps the transfer characteristic 611 that is obtained when it is assumed that the length of the bias supply line 501 is 0 mm.

As is apparent from the transfer characteristics 621, and 631 to 633, the transfer characteristic of the signal may be improved by connecting the capacitor 141 to the bias supply line 501. The transfer characteristic of the signal may be also improved with increasing the capacitance C1 of the capacitor 141. For example, when the capacitance C1 of the capacitor 141 is 100 pF or larger, a transfer characteristic becomes nearly equal to that obtained when the length of the bias supply line 501 is assumed to be 0 mm.

Figure 6D:
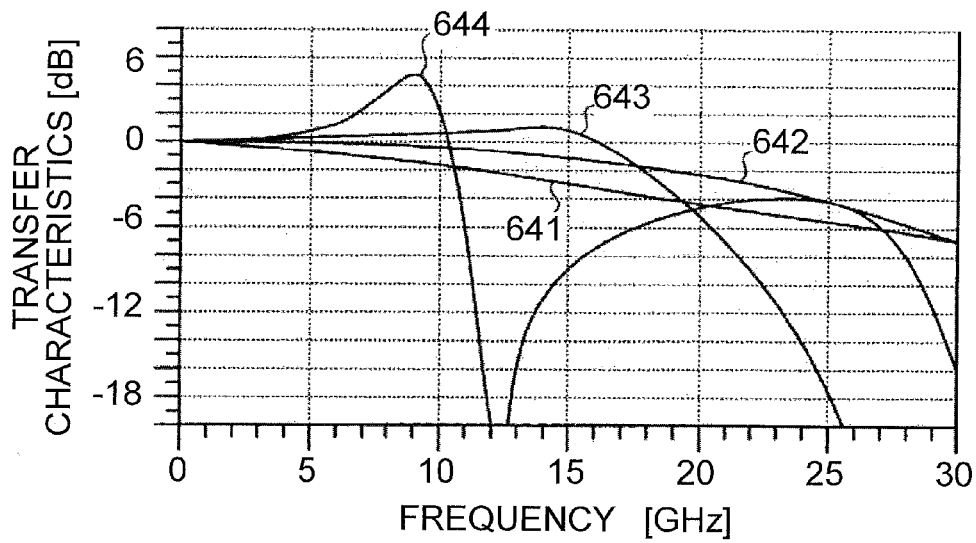
FIG. 6D is a graph illustrating a fourth example of the results of the simulation of the signal transfer characteristics.

FIG. 6D is a graph illustrating a fourth example of the results of the simulation of the transfer characteristics of the signal. In FIG. 6D, the horizontal axis indicates the frequency (GHz), and the vertical axis indicates the transfer characteristic (dB) of the signal. A transfer characteristic 641 in FIG. 6D indicates a transfer characteristic of the signal assuming that the capacitor 141 is connected to a portion at a distance 0 mm apart from the cathode of the PD 121 in the simulation model 500 illustrated in FIG. 5B.

Transfer characteristics 642, 643, 644 each indicate the respective transfer characteristics of the signal when the capacitor 141 is connected to a portion at a distance 1 mm, 2 mm, 5 mm apart from the cathode of the PD 121, respectively.

The transfer characteristics 643 and 644 explain that the transfer characteristic of the signal is improved by decreasing the distance between the cathode of the PD 121 and the capacitor 141. For example, it is apparent from the transfer characteristics 641 and 642 that a transfer characteristic of a signal is improved by connecting the capacitor 141 to a portion at a distance 1 mm or the less apart from the cathode of the PD 121.

[Simulation Results in the Case of Use of Wiring Implementation]

Figure 6E:
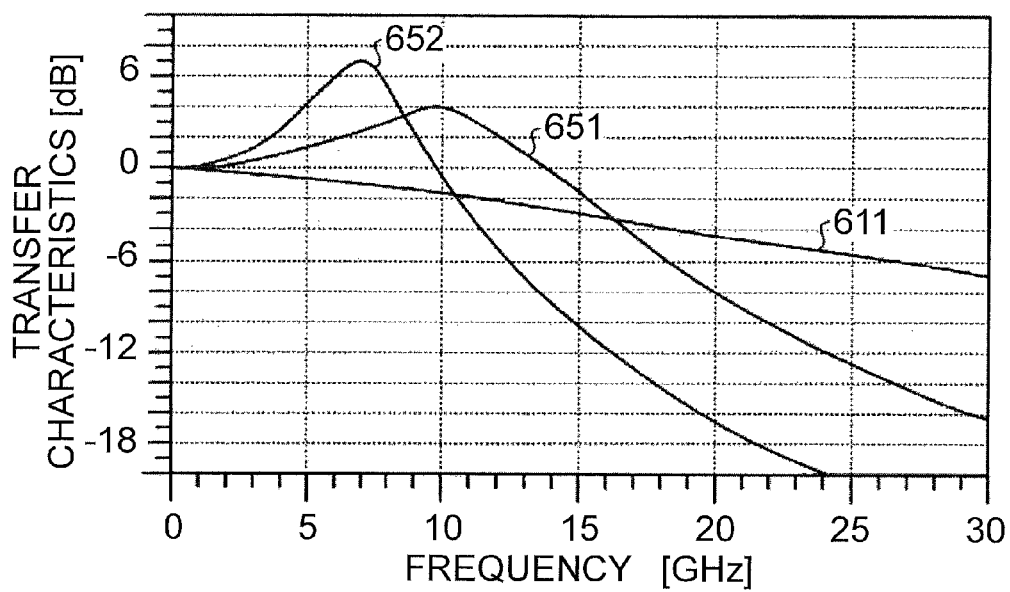
FIG. 6E is a graph illustrating a fifth example of the results of the simulation of the signal transfer characteristics.

Next with reference with FIGS. 6A and 6E, transfer characteristics of the signal in the case of using the bias supply line 501 and the signal line 502 implemented with wires (refer to FIGS. 4A and 4B). In the case of using the bias supply line 501 and the signal line 502 implemented with wires, the transfer characteristic of the signal without the capacitor 141 connected to the bias supply line 501 is same as the transfer characteristics 611 to 613 illustrated in FIG. 6A.

FIG. 6E is a graph illustrating a fifth example of the results of the simulation of the transfer characteristics of the signal. In FIG. 6E, the horizontal axis indicates the frequency (GHz), and the vertical axis indicates the transfer characteristic (dB) of the signal. In FIG. 6E, parts that are the same as the parts illustrated in FIG. 6A are indicated by the same reference numerals and a description thereof is omitted. FIG. 6E illustrates the transfer characteristics of the signal when the bias supply line 501 and the signal line 502 are formed using the wiring implementation (refer to FIGS. 4A and 4B).

A transfer characteristic 651 indicates a transfer characteristic of the signal when the length of the bias supply line 501 is 1 mm and the capacitor 141 of the capacitance C1 100 pF is connected to the bias supply line 501. A transfer characteristic 652 indicates a transfer characteristic of the signal when the length of the bias supply line 501 is 2 mm and the capacitor 141 of the capacitance C1 100 pF is connected to the bias supply line 501.

The transfer characteristics 611 to 613, 651, and 652 illustrated in FIGS. 6A and 6E explain that connecting the capacitor 141 to the bias supply line 501 enables the transfer characteristic of the signal to be improved. For example, the transfer characteristic 652 obtained in the condition of the bias supply line 501 of 2 mm long with the capacitor 141 connected therewith is nearly equal to the transfer characteristic 612 obtained in the condition that the length of the bias supply line 501 is 1 mm.

[Improvement of Transfer Characteristic by Capacitor]

Next, it is explained that the reason why the transfer characteristic of the signal is improved by the capacitor 141. When the capacitor 141 is not provided in the model for simulating the transfer characteristic as illustrated in FIG. 5A, a portion of stable potential is that of the TIA 131. Thus, a line length causing a degradation of the transfer characteristic of the signal is the sum of the lengths of the bias supply line 501 and the signal line 502, for example.

Meanwhile, when the capacitor 141 is connected to a portion in the vicinity of the cathode of the PD 121 as illustrated in FIG. 5B, a potential of the cathode of the PD 121 is stabilized by the capacitor 141. In this case, therefore, a line length causing a degradation of the transfer characteristic of the signal is the length of the signal line 502, for example. Thus, providing the capacitor 141 reduces the line length that causes the degradation of the transfer characteristic. Therefore, the transfer characteristic of the signal may be improved.

In the optical receiver 100 according to the first embodiment, the impedances of the sides of the cathodes are decreased by connecting the capacitors 141 to 144 to the cathode sides of the PDs 121 to 124 of the PD array 120. Thus, even when the PDs 121 to 124 are arranged at the narrow pitches, the broadband characteristic may be ensured.

[Second Embodiment]
[Configuration of Optical Transmitter]

Figure 7:
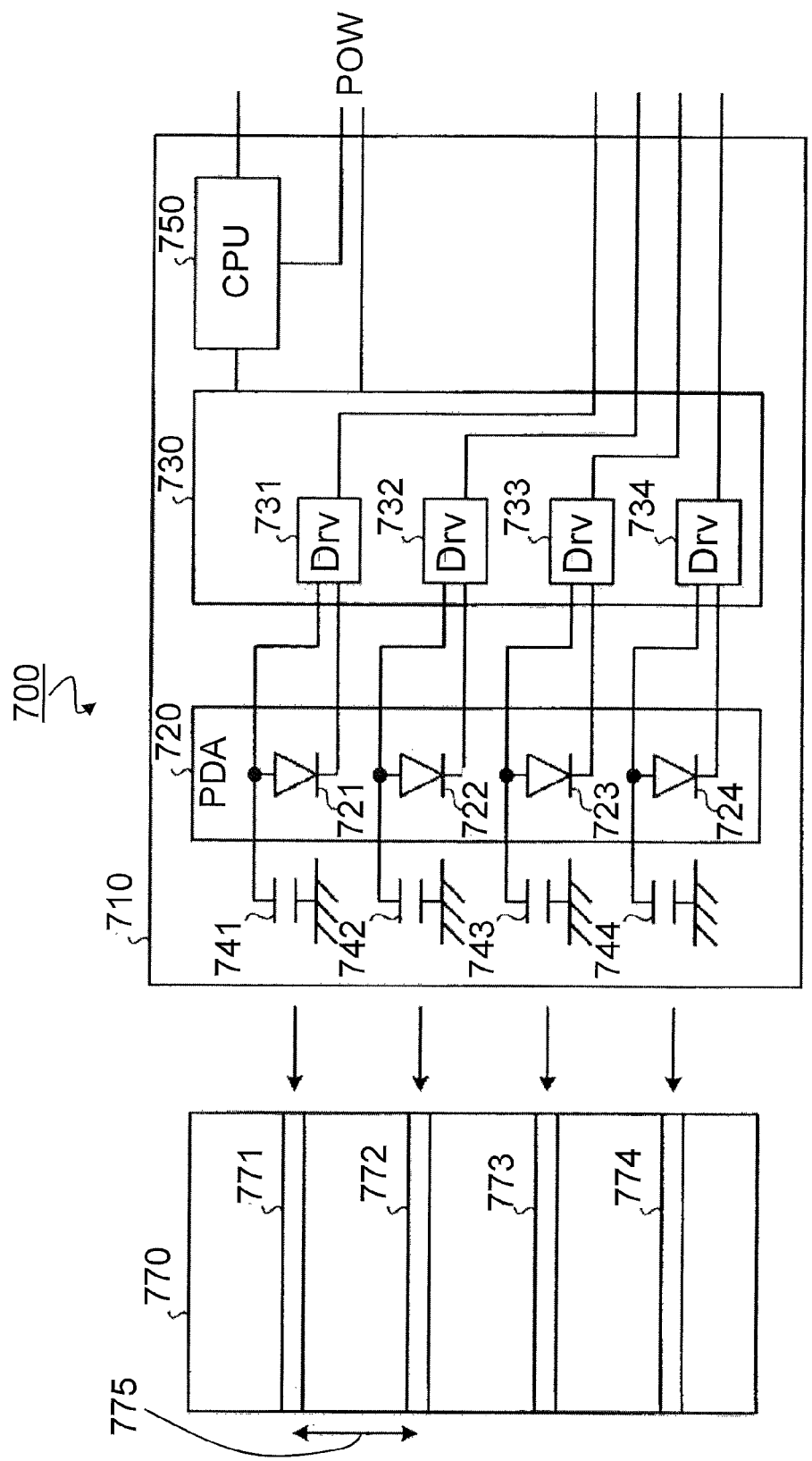
FIG. 7 is a diagram illustrating an example of an optical transmitter according to a second embodiment.

FIG. 7 is a diagram illustrating an example of an optical transmitter according to a second embodiment. The optical transmitter 700 is a device that generates light to be entered on optical transmission lines 771 to 774 arranged in an optical transmission line array 770. The optical transmission lines 771 to 774 are optical fibers or optical waveguides, for example. As illustrated in FIG. 7, the optical transmitter 700 includes a board 710, a laser diode (LD) array 720, a driving circuit 730, capacitors 741 to 744 and a CPU 750. The board 710 is connected to the optical transmission line array 770. The board 710 is a flexible board, for example. Reference numeral 775 indicates a pitch, for example 0.25 mm, at which the optical transmission lines 771 to 774 are arranged.

On the board 710, there is provided the LD array 720 in which laser diodes (LDs) 721 to 724 are arrayed. The LDs 721 to 724 are, for example, vertical cavity surface emitting lasers (VCSELs). The LDs 721 to 724 generate light by using bias voltages supplied to anodes and current signals input to cathodes thereof. The light generated by the LDs 721 to 724 enters the optical transmission lines 771 to 774. The anodes and cathodes of the LDs 721 to 724 are connected to the driving circuit 730.

By control of the CPU 750 the driving circuit 730 converts an input voltage signal into a current signal. Specifically, the driving circuit 730 includes driving units (Drv) 731 to 734 which serve as bias supply units. The bias supply units each apply bias voltages to the respective anodes (first electrodes) of the LDs 721 to 724 by using power supplied from, for example, an external power supply. The driving units 731 to 734 also serve as conversion circuits for converting voltage signals input from an upstream-side electrical processing circuit into current signals which are fed to the cathodes (second electrodes) of the LDs 721 to 724, respectively.

In addition, it is preferable that characteristic impedances of output impedances of the driving units 731 to 734 (conversion circuits) are matched with characteristic impedances of lines connecting the cathodes (second electrodes) of the LDs 721 to 724 to the driving units 731 to 734, that is to say "impedance matching." The impedance matching enables transfer characteristics of signals between the driving units 731 to 734 and the LDs 721 to 724 to be improved.

The capacitors 741 to 744 have ends connected to the anodes of the LDs 721 to 724. The other ends of the capacitors 741 to 744 are grounded. This configuration may reduce impedances of the anode sides of the LDs 721 to 724 and stabilize signals that are input to the LDs 721 to 724 from the driving units 731 to 734. The CPU 750 operates using power supplied from, for example, the external power supply to control the driving circuit 730 on the basis of a control signal supplied from, for example, an external.

There has been described above on a configuration in which the function of the bias supply units for applying the bias voltages to the LDs 721 to 724 are achieved by the driving units 731 to 734. The functions are not limited to this configuration. For example, the bias supply units for applying the bias voltages to the LDs 721 to 724 may be separated from the driving units 731 to 734.

With reference to FIG. 7, there has been explained on the optical transmitter 700 as an anode driving type in which the bias voltages are supplied to the anodes of the LDs 721 to 724. However, the optical transmitter 700 may be also configured as a cathode driving type in which bias voltages are supplied to the cathodes of the LDs 721 to 724. In the case of the cathode driving type, the capacitors 741 to 744 are connected to the cathodes of the LDs 721 to 724. In other words, the capacitors 741 to 744 are connected to the electrodes (first electrodes) of the LDs 721 to 724, while the bias voltages are supplied to the electrodes (first electrodes) of the LDs 721 to 724.

In the case of the cathode driving type, it is preferable that characteristic impedances of lines for connecting the anodes (second electrodes) of the LDs 721 to 724 to the driving units 731 to 734 are matched to the outputs impedances of the driving units 731 to 734. In other words, the characteristic impedances of the lines for connecting the electrodes (second electrodes) of the LDs 721 to 724 with the driving units 731 to 734 may be matched to the outputs impedances of the driving units 731 to 734, while the current signals are supplied to the electrodes (second electrodes) of the LDs 721 to 724. Thus, the transfer characteristics of the signals between the driving units 731 to 734 and the LDs 721 to 724 may be improved.

The optical transmitter 700 may be achieved by replacing the PDs 121 to 124 with the LDs 721 to 724 in the optical receiver 100 illustrated in FIGS. 3A to 3C or FIGS. 4A and 4B. Thus, a simulation model of the optical transmitter 700 may be considered as a model that is the same as or similar to the simulation model 500, illustrated in FIGS. 5A and 5B, of the optical receiver 100. Thus, signal transfer characteristics of the optical transmitter 700 may be considered as transfer characteristics that are the same as or similar to the signal transfer characteristics, illustrated in FIGS. 6A to 6E, of the optical receiver 100.

For example, the transfer characteristic of the signal may be improved by matching the characteristic impedance of the signal line 502 with the output impedance of the driving unit 731 (impedance matching). In addition, a line length causing a degradation of the transfer characteristic may be reduced by connecting the capacitor 741 to the electrode (first electrode) of the LDs 721, while the bias voltage is supplied to the electrode (first electrode) of the LDs 721. Thus, the transfer characteristic of the signal may be improved.

In the same manner as the optical receiver 100 illustrated in FIGS. 3A to 3C, at least some of the capacitors 741 to 744 may be arranged on the side of a front surface (first surface) of the board 710, while the other of the capacitors 741 to 744 may be arranged on the side of a back surface (second surface) of the board 710. In this case, even when the LDs 721 to 724 are arranged at narrow pitches, the capacitors 741 to 744 may be connected to the LDs 721 to 724, respectively. The capacitors 741 to 744 may be alternately arranged on the sides of the front and back surfaces of the board 710 in a direction in which the LDs 721 to 724 are arranged. This configuration enables distances between the LDs 721 to 724 and the capacitors 741 to 744 to be small values and signal transfer characteristics of channels to be improved.

In addition, an optical communication device may be configured so as to include both of the optical receiver 100 and the optical transmitter 700 illustrated in FIGS. 1 and 7, respectively. In this case, a single CPU may achieve the function of the CPU 150 and the CPU 750 or a common power may be applicable to electrify both of the optical receiver 100 and the optical transmitter 700. Furthermore, the optical transmission line array 170 and the optical transmission line array 770 may be achieved using a single optical transmission line array.

In the optical transmitter 700 according to the second embodiment, the impedances of the first electrodes of the LDs 721 to 724 of the LD array 720 may be reduced by connecting the capacitors 741 to 744 to the first electrodes of the LDs 721 to 724 of the LD array 720. Thus, even when the LDs 721 to 724 are arranged at the narrow pitches, a broadband characteristic may be ensured.

As described above, the optical receiver and the optical transmitter may each have the broadband characteristic that satisfies a wide frequency range of a signal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An optical receiver comprising:
a board configured to be coupled with an optical transmission line array, the optical transmission line array including a plurality of optical transmission lines;
an optical diode array disposed on the board, the optical diode array including a plurality of photo diodes, each of the plurality of photo diodes receiving light from a corresponding one of the plurality of optical transmission lines, each of the plurality of photo diodes including a first electrode and a second electrode;
a plurality of bias suppliers, each of the plurality of bias suppliers being configured to apply a bias voltage to the first electrode of a corresponding one of the plurality of photo diodes;
a plurality of conversion circuits, each of the plurality of conversion circuits being configured to convert a current signal flowing through the second electrode of the corresponding one of the plurality of photo diodes into a voltage signal and to output the voltage signal; and
a plurality of capacitors, each of the plurality of capacitors having a first end and a second end, the first end being coupled to the first electrode of the corresponding one of the photo diodes, the second end being electrically grounded, wherein
each one of the plurality of photo diodes includes:
    a first pad coupled with the first electrode and the bias supplier,
    a second pad coupled with the second electrode and the conversion circuit, and
    a third pad coupled with the first pad and the capacitor, wherein the first and second pads are formed in a vicinity of a first end of the photo diode array, the third pad is formed in a vicinity of a second end of the photo diode array, and the first end and the second end are opposite ends with respect to one another.

2. The optical receiver according to claim 1, wherein characteristic impedance of a line coupling the second electrode to the conversion circuit is adjusted so as to be equivalent to input impedance of the conversion circuit.

3. The optical receiver according to claim 1, wherein the plurality of capacitors are provided at a first surface side of the board and at a second surface side of the board, the first surface side is associated with a first surface of the board, the second surface side is associated with a second surface of the board, the first surface and the second surface are opposite each other, and the photo diode array is mounted at the first surface.

4. The optical receiver according to claim 3, wherein the plurality of capacitors are provided at the first surface side and the second surface side alternatively in a direction same to a direction in that the plurality of photo diodes are arrayed.

5. The optical receiver according to claim 3, wherein the optical transmission line array is disposed on the second surface, one of the plurality of capacitors provided at the second surface side is disposed on a first surface of the optical transmission array, the first surface is opposite to a second surface of the optical transmission array, the second surface of the optical transmission array faces to the second surface of the board, and the one of the plurality of capacitors is electrically coupled with the first electrode via a through hole formed in the optical transmission line array.

6. The optical receiver according to claim 1, wherein the first electrode is electrically coupled with a corresponding one of the plurality of bias suppliers by use of a flip chip connection.

7. The optical receiver according to claim 1, wherein the first electrode is electrically coupled with a corresponding one of the plurality of bias suppliers by use of a wiring connection.

8. An optical transmitter comprising:
a board configured to be coupled with an optical transmission line array, the transmission line array including a plurality of optical transmission lines;
an laser diode array disposed on the board, the laser diode array including a plurality of laser diodes, each of the a plurality of laser diodes emitting light into a corresponding one of the plurality of optical transmission lines, each of the plurality of laser diodes including an anode and a cathode;
a plurality of bias suppliers, each of the plurality of bias suppliers being configured to apply a bias voltage to the anode of a corresponding one of the plurality of laser diodes;
a plurality of driving circuits, each of the plurality of driving circuits being configured to convert an input voltage signal from an upstream-side electrical processing circuit into a current signal and to feed the current signal to the cathode; and
a plurality of capacitors, each of the plurality of capacitors including a first end and a second end, the first end being electrically coupled to the anode of the corresponding one of the laser diodes, the second end electrically being grounded, wherein
each one of the plurality of laser diodes includes:
    a first pad coupled with the cathode and the bias supplier,
    a second pad coupled with the anode and the diving circuit, and
    a third pad coupled with the first pad and the capacitor, wherein the first and second pads are formed in a vicinity of a first end of the laser diode array, the third pad is formed in a vicinity of a second end of the laser diode array, and the first end and the second end are opposite ends with respect to one another.

* * * * *

UNITED STATES PATENT AND TRADEMARK OFFICE
CERTIFICATE OF CORRECTION

PATENT NO.         : 8,891,975 B2                         Page 1 of 1
APPLICATION NO.    : 13/305870
DATED              : November 18, 2014
INVENTOR(S)        : Takatoshi Yagisawa et al.

It is certified that error appears in the above-identified patent and that said Letters Patent is hereby corrected as shown below:

On the Title Page

Column 2, item [57] (abstract), line 8, delete "real" and insert -- rear --, therefor.

In the Claims

Column 14, line 19, in Claim 8, delete "each of the a" and insert -- each of the --, therefor.
Column 14, line 40, in Claim 8, delete "diving" and insert -- driving --, therefor.

Signed and Sealed this
Fifth Day of May, 2015

Michelle K. Lee
*Director of the United States Patent and Trademark Office*